United States Patent
Kuo et al.

(10) Patent No.: US 9,590,172 B2
(45) Date of Patent: Mar. 7, 2017

(54) SENSING DEVICE

(71) Applicant: Au Optronics Corporation, Hsinchu (TW)

(72) Inventors: Chih-Che Kuo, Taipei (TW); Tokuro Ozawa, Nagano (JP); Koji Aoki, Chiba (JP); Chia-Wei Chang, Kaoshsiung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/631,865

(22) Filed: Feb. 26, 2015

(65) Prior Publication Data

US 2015/0280109 A1    Oct. 1, 2015

(30) Foreign Application Priority Data

Apr. 1, 2014 (TW) .............................. 103112159 A

(51) Int. Cl.
*H01L 43/06* (2006.01)
*G01R 33/07* (2006.01)
*H01L 43/04* (2006.01)

(52) U.S. Cl.
CPC ............ *H01L 43/065* (2013.01); *G01R 33/07* (2013.01); *H01L 43/04* (2013.01)

(58) Field of Classification Search
CPC .............................. H01L 43/065; G01R 33/07
See application file for complete search history.

(56) References Cited

U.S. PATENT DOCUMENTS 3,448,353 A * 6/1969 Corak .................... H01L 29/00
148/33
3,789,311 A * 1/1974 Masuda .................. H01L 43/06
257/425

(Continued)

FOREIGN PATENT DOCUMENTS

| CN | 1136714 | 11/1996 |
|----|---------|---------|
| JP | S55132066 | 10/1980 |

(Continued)

OTHER PUBLICATIONS

Solin et al., "Enhanced Room-Temperature Geometric Magnetoresistance in Inhomogeneous Narrow-Gap Semiconductors," Science, Sep. 1, 2000, pp. 1530-1532.

(Continued)

*Primary Examiner* — Evan Pert
(74) *Attorney, Agent, or Firm* — Jianq Chyun IP Office

(57) ABSTRACT

A sensing device is provided. The sensing device includes a semiconductor layer, a first electrode and a second electrode, a first detection electrode and a second detection electrode, and at least one conductive pattern. The first electrode and the second electrode are disposed at opposite ends of the semiconductor layer. The first detection electrode and the second detection electrode are disposed at the other opposite ends of the semiconductor layer, wherein a virtual connection line is provided through the first detection electrode and the second detection electrode. The at least one conductive pattern is disposed on the semiconductor layer, wherein the conductive pattern does not overlap with the virtual connection line.

20 Claims, 16 Drawing Sheets

(56) References Cited

U.S. PATENT DOCUMENTS

| | | | | |
|---|---|---|---|---|
| 3,800,193 A * | 3/1974 | Ashar | G01R 33/07 | 257/422 |
| 4,204,132 A * | 5/1980 | Kataoka | H01L 43/065 | 257/E43.003 |
| 4,223,292 A * | 9/1980 | Morikawa | H01L 43/065 | 257/425 |
| 4,251,795 A * | 2/1981 | Shibasaki | H01L 43/08 | 257/E43.004 |
| 4,296,424 A * | 10/1981 | Shibasaki | H01L 21/3221 | 174/257 |
| 5,208,477 A * | 5/1993 | Kub | H01L 29/82 | 257/421 |
| 5,543,988 A * | 8/1996 | Brady | G01R 33/06 | 257/421 |
| 5,679,973 A | 10/1997 | Mochizuki et al. | | |
| 6,590,389 B1 | 7/2003 | Shibasaki et al. | | |
| 7,253,490 B2 * | 8/2007 | Oohira | G01R 33/07 | 257/424 |
| 7,723,814 B2 * | 5/2010 | Shibasaki | G01R 33/06 | 257/421 |
| 9,222,991 B2 * | 12/2015 | Ausserlechner | G01R 33/07 | |
| 2005/0230770 A1 * | 10/2005 | Oohira | G01R 33/07 | 257/421 |
| 2009/0001351 A1 * | 1/2009 | Shibasaki | G01R 33/06 | 257/14 |
| 2012/0139535 A1 * | 6/2012 | Watanabe | G01R 33/07 | 324/252 |
| 2012/0229131 A1 | 9/2012 | Takenaga et al. | | |
| 2015/0280109 A1 * | 10/2015 | Kuo | H01L 43/065 | 257/421 |
| 2016/0093797 A1 * | 3/2016 | Ausserlechner | G01R 33/07 | 257/421 |

FOREIGN PATENT DOCUMENTS

| | | |
|---|---|---|
| JP | 64-067987 | 3/1989 |
| JP | H11-340541 | 12/1999 |
| TW | 393567 | 6/2000 |
| TW | 201133015 | 10/2011 |

OTHER PUBLICATIONS

Moussa et al, "Finite-Element Modeling of Extraordinary Magnetoresistance in Thin Film Semiconductors with Metallic Inclusions," Physical Review B, Oct. 17, 2001, pp. 184410-1-184410-8.

* cited by examiner

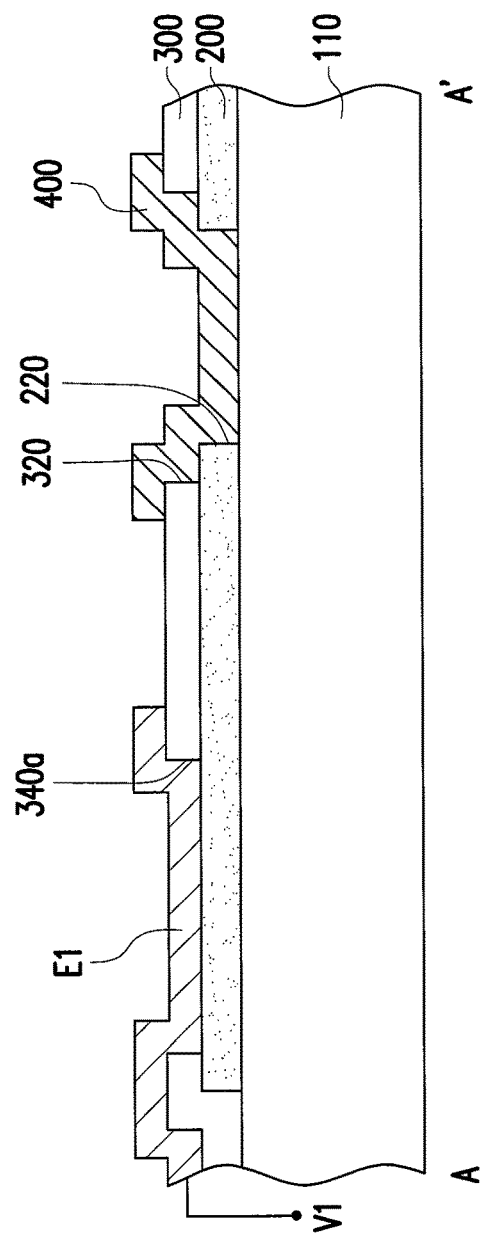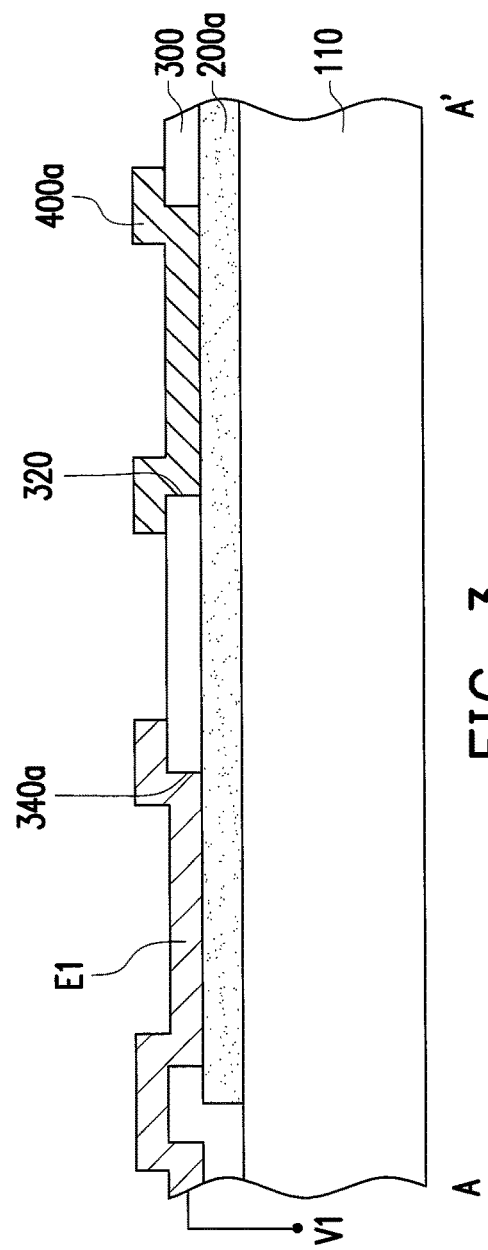

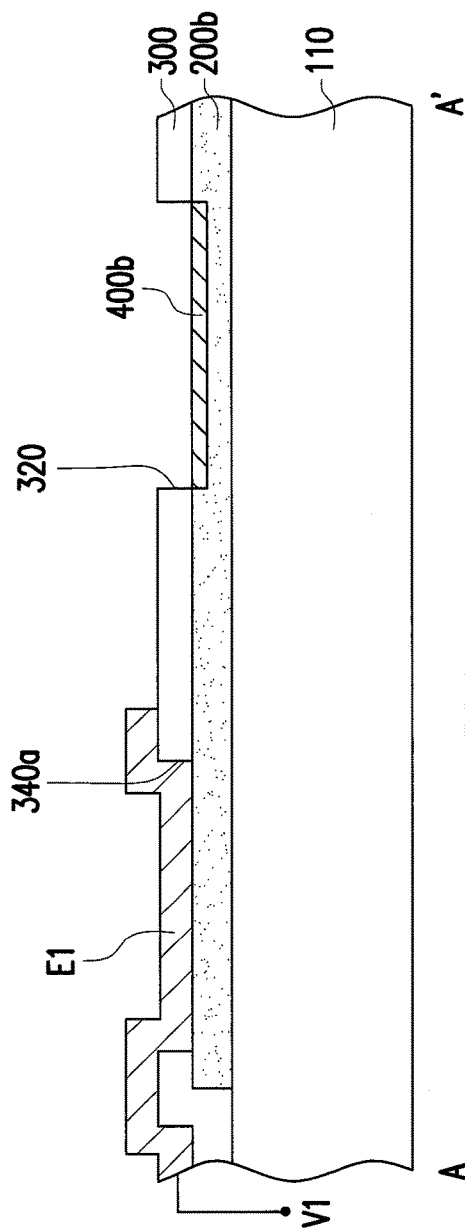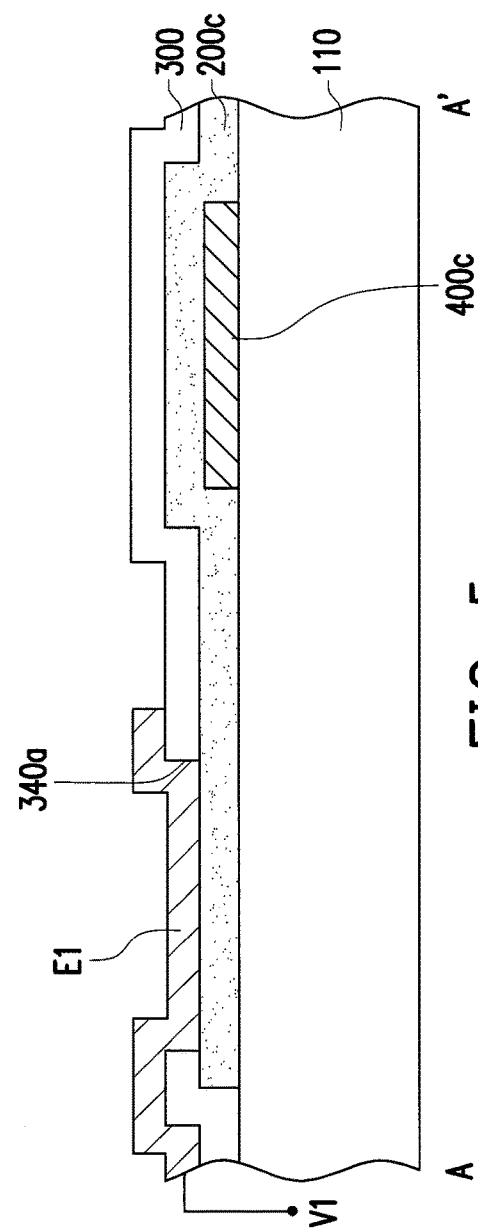

SENSING DEVICE

CROSS-REFERENCE TO RELATED APPLICATION

This application claims the priority benefit of Taiwan application serial no. 103112159, filed on Apr. 1, 2014. The entirety of the above-mentioned patent application is hereby incorporated by reference herein and made a part of this specification.

BACKGROUND OF THE INVENTION

Field of the Invention

The invention relates to a sensing device, and more particularly, relates to a magnetic field sensing device capable of improve the Hall Effect.

Description of Related Art

The Hall Effect is a sensing method widely used to detect physical quantity such as the magnetic field. When current horizontally flows through a device placed under action of a vertical magnetic field, a voltage difference is generated at opposite ends of a device on a current direction perpendicular to a magnetic field direction. A magnitude of such voltage difference is proportional to the magnetic field, and this phenomenon is known as the Hall Effect. In the Hall Effect, the voltage difference generated due to the magnetic field is known as the Hall voltage. Other than sensing the magnetic field, the Hall Effect may also be applied in proximity sensors, counters, tachometers, current sensors and so on.

The Hall voltage and the magnetoresistance (MR) are the two aspects of the Hall Effect. When the Hall device is under action of the magnetic field, a current path increases due to shifts under action of the magnetic field, which causes resistance thereof to change with the magnetic field strength, and this is known as the magnetoresistance. A conventional magnetoresistance device forms a structure close to connection in series, so that the magnetoresistance can effectively increase amount of magnetic field variations. In low magnetic field environment, the resistance is small because current is focused to flow through metal pattern due to difference between conductivities of metal and semiconductor. However, in high magnetic field environment, an overall resistance increases because current is under action of the Lorentz force which reduces current in the metal pattern to cause increases of current flowing through the semiconductor region.

Generally, magnetic field sensitivity of the magnetoresistance device is higher than magnetic field sensitivity of the Hall device. However, the magnetoresistance device cannot effectively identify direction of the magnetic field, thus applications thereof are restricted in fields of the proximity sensors, the counters, the tachometers and so on. On the contrary, although the Hall device is capable of correctly detecting direction and magnitude of the magnetic field, a numerical magnitude being sensed is quite limited. As the numerical magnitude becomes smaller with as dimension of the device reduces, devices such as amplification circuit may be additionally disposed for increasing signal strength, and this may lead to problem of signal to noise (SN) ratio because noise is also amplified. In order to satisfy miniaturization of the device while maintaining the magnetic field sensitivity thereof, a decision usually needs to be made between the magnetoresistance device and the Hall device. The Hall device or the magnetoresistance device in the conventional art is composed of semiconductor materials, a performance thereof is depended on a carrier mobility, and the carrier mobility is depended on temperature. Therefore, the Hall device or the magnetoresistance device in the conventional art has high dependence on temperature. Accordingly, it is needed to develop a sensing device which is capable of taking consideration of the both the sensing capability to the magnetic field direction and the high sensitivity to the magnetic field, which is also a sensing device having less dependence on temperature for the magnetic sensing property.

SUMMARY OF THE INVENTION

The invention is directed to a sensing element taken consideration of both the sensing capability to the magnetic field direction and the high sensitivity to the magnetic field, and such sensing device has less dependence on temperature for the magnetic sensing property.

The sensing device of the invention includes a semiconductor layer, a first electrode and a second electrode, a first detection electrode and a second detection electrode, and at least one conductive pattern. The first electrode and the second electrode are disposed at opposite ends of the semiconductor layer. The first detection electrode and the second detection electrode are disposed at the other opposite ends of the semiconductor layer, wherein a virtual connection line is provided through the first detection electrode and the second detection electrode. The at least one conductive pattern is disposed on the semiconductor layer, wherein the conductive pattern does not overlap with the virtual connection line.

Based on above, in the sensing device of the invention, an active layer hybridized with metal and semiconductor. Accordingly, in comparison with the sensing device only composed of semiconductor, the sensing device has less dependence on temperature for the magnetic sensing magnetic sensing property. In addition, by providing the conductive patterns with different shapes and different distribution densities with respect to the semiconductor layer, the sensing device of the invention is capable of taking consideration of the both the sensing capability to the magnetic field direction and the high sensitivity to the magnetic field.

To make the above features and advantages of the disclosure more comprehensible, several embodiments accompanied with drawings are described in detail as follows.

BRIEF DESCRIPTION OF THE DRAWINGS

FIG. 2 is a local cross-sectional view illustrating the sensing device of FIG. 1 along section-line A-A'.

FIG. 3 is another local cross-sectional view illustrating the sensing device of FIG. 1 along section-line A-A'.

FIG. 4 is yet another local cross-sectional view illustrating the sensing device of FIG. 1 along section-line A-A'.

FIG. 5 is still another local cross-sectional view illustrating the sensing device of FIG. 1 along section-line A-A'.

DESCRIPTION OF THE EMBODIMENTS

Figure 1:
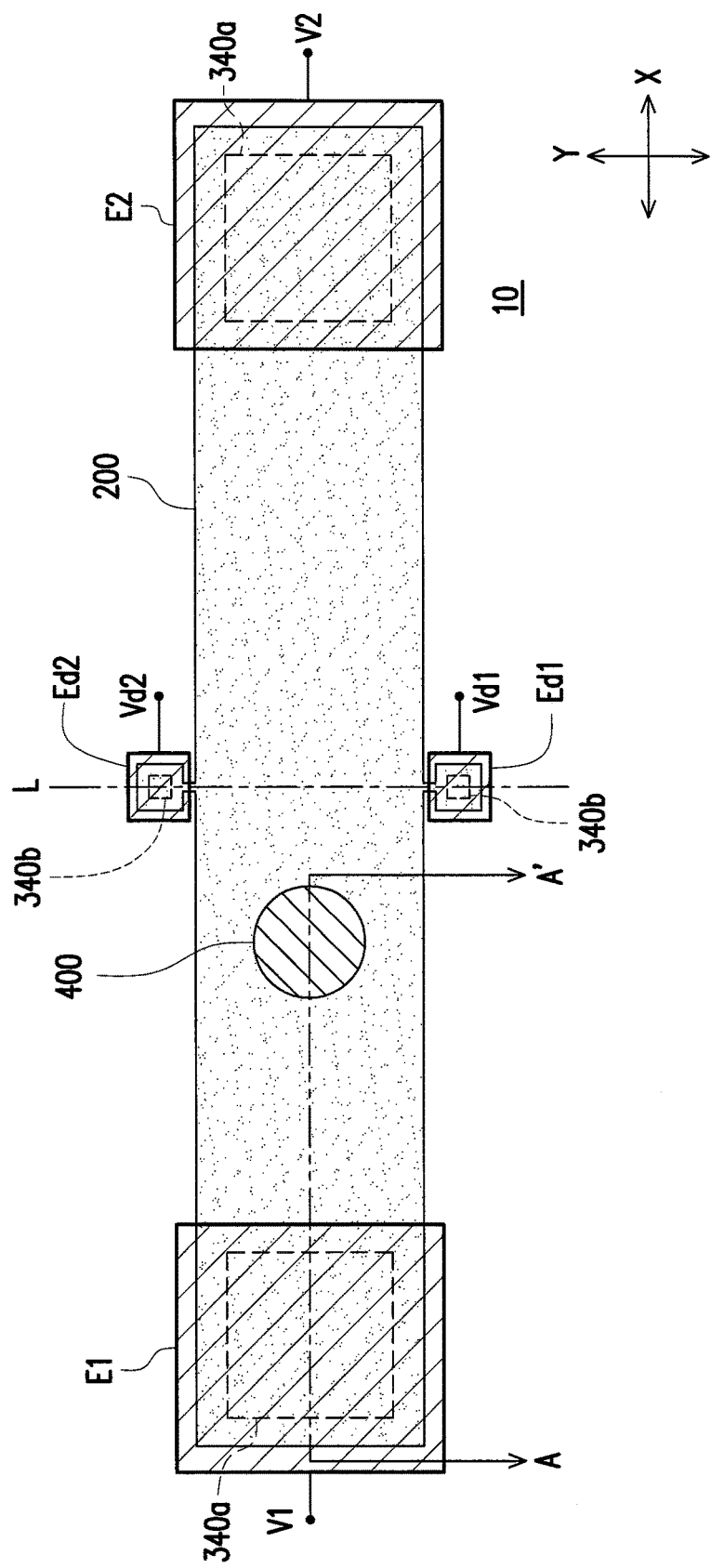
FIG. 1 is a top view of a sensing device according to an embodiment of the invention.

FIG. 1 is a top view of a sensing device according to an embodiment of the invention. FIG. 2 is a local cross-sectional view illustrating the sensing device of FIG. 1 along section-line A-A'. Referring to FIG. 1 and FIG. 2 together, in the present embodiment, a sensing device 10 includes a substrate 110, a semiconductor layer 200, a first electrode E1 and a second electrode E2, a first detection electrode Ed1 and a second detection electrode Ed2, and at least one conductive pattern 400. According to an embodiment, the sensing device 10 further includes an insulation layer 300. For illustrative convenience, the insulation layer 300 is omitted in FIG. 1.

The substrate 110 may be any insulating materials such as a glass or a silicon substrate having insulation layer.

The semiconductor layer 200 is disposed on the substrate 110, and composed of a common semiconductor such as InSb, InAs, GaAs, AlInSb, AlInAs, Si, InGaZnO or other suitable semiconductor materials. The semiconductor layer 200 has an opening 220 to expose the substrate 110.

The isolation layer 300 is disposed on the semiconductor layer 200. The insulation layer 300 may be $Si_3N_4$, $Al_2O_3$ or other suitable insulation materials. The insulation layer 300 has a first opening 320 and contact openings 340a and 340b. The first opening 320 exposes the opening 220 of the semiconductor layer 200, and the contact openings 340a and 340b expose the semiconductor layer 200.

The first electrode E1 and the second electrode E2 are disposed on the semiconductor layer 200, and disposed at opposite ends of the semiconductor layer 200. More specifically, the first electrode E1 and the second electrode E2 are opposite to each other on X direction. A material of the first electrode E1 and the second electrode E2 includes a metal or other suitable electrode materials. The first electrode E1 and the second electrode E2 are contacted with the semiconductor layer 200 respectively through the contact opening 340a. During operations of the sensing device 10, the first electrode E1 and the second electrode E2 are applied with voltages V1 and V2, respectively.

In the present embodiment, the first detection electrode Ed1 and the second detection electrode Ed2 are disposed on the semiconductor layer 200, and disposed at the other opposite ends of the semiconductor layer 200. More specifically, the first detection electrode Ed1 and the second detection electrode Ed2 are opposite to each other on Y direction. A material of the first detection electrode Ed1 and the second detection electrode Ed2 includes a metal or other suitable electrode materials, which may be identical to or different from the material of the first electrode E1 and the second electrode E2. The first detection electrode Ed1 and the second detection electrode Ed2 are contacted with the semiconductor layer 200 respectively through the contact opening 340b. During operations of the sensing device 10, the first detection electrode Ed1 and the second detection electrode Ed2 are electrically connected to voltages Vd1 and Vd2, respectively. As shown in FIG. 1, a virtual connection line L passes through the first detection electrode Ed1 and the second detection electrode Ed2, and the first electrode E1 and the second electrode E2 are symmetrically disposed with respect to the virtual connection line L. It is worth mentioning that, by disposing the first detection electrode Ed1 and the second detection electrode Ed2 at center positions, the Hall voltage of the sensing device 10 may be greater and relatively more stable, but the invention is not limited thereto.

The conductive pattern 400 is disposed on the semiconductor layer 200. A material of the conductive pattern 400 is a non-magnetic conductive material which includes metals such as Au, Cu, Ag, Ti, Al, Mos or an alloy thereof. Alternatively, the conductive pattern 400 may also be composed of a nano carbon material having properties of both semiconductor and metal, such as carbon nanotube, graphene and so on, but the invention is not limited thereto. A material of the conductive pattern 400 may be identical to or different from that of the first electrode E1 and the second electrode E2 and that of the first detection electrode Ed1 and the second detection electrode Ed2. The conductive pattern 400 is filled into the opening 220 of the semiconductor layer 200 through the first opening 320 of the insulation layer 300 to be contacted with the semiconductor layer 200. In other words, the conductive pattern 400 is embedded in the semiconductor layer 200.

It is worth mentioning that, a position where the conductive pattern 400 is disposed does not overlap with the virtual connection line L passed through the first detection electrode Ed1 and the second detection electrode Ed2. In the present embodiment, the conductive pattern 400 is a single circular shape. However, the invention is not limited thereto. The conductive pattern 400 may also be a plurality of arbitrary shapes, such as a rectangle, an ellipse, a square and so on.

In the present embodiment, the conductive pattern 400 is embedded in the semiconductor layer 200. However, the invention is not limited thereto. In other embodiments, the conductive pattern 400 may also be disposed by using other methods. The methods for disposing the conductive pattern 400 are described below by reference with FIG. 3 to FIG. 5.

FIG. 3 is another local cross-sectional view illustrating the sensing device of FIG. 1 along section-line A-A'. The embodiment of FIG. 3 is similar to the embodiment of FIG. 2, thus identical or similar elements are indicated by identical or similar reference numbers, and the descriptions thereof are not repeated. As shown in FIG. 3, a semiconductor layer 200a does not include an opening. Similarly, the insulation layer 300 covered on the semiconductor layer 200a may also include the first opening 320 and the contact opening 340a. The first opening 320 and the contact opening 340a both expose the semiconductor layer 200a. A conductive pattern 400a is filled into the first opening of the insulation layer 300 to be contacted with the semiconductor layer 200. In other words, the conductive pattern 400a is stacked on the semiconductor layer 200a. Referring to FIG. 1 and FIG. 3 together, the first detection electrode Ed1 and the second detection electrode Ed2, the first electrode E1 and the second electrode E2 are contacted with the semiconductor layer 200a respectively through the contact openings 340b and 340a.

FIG. 4 is yet another local cross-sectional view illustrating the sensing device of FIG. 1 along section-line A-A'. As shown in FIG. 4, a semiconductor layer 200b does not include an opening; and similarly, the insulation layer 300 covered on the semiconductor layer 200b may also include the first opening 320 and the contact opening 340a. The first opening 320 and the contact opening 340a both expose the semiconductor layer 200b. In particular, in case a conductive pattern 400b is of the metal, an anneal process may be used so that metal ions of the conductive pattern 400b may spread into the semiconductor layer 200b through the first opening 320 of the insulation 300. In other words, the conductive pattern 400b is doped into the semiconductor layer 200b. Referring to FIG. 1 and FIG. 4 together, the first detection electrode Ed1 and the second detection electrode Ed2, the first electrode E1 and the second electrode E2 are contacted with the semiconductor layer 200a respectively through the contact openings 340b and 340a.

FIG. 5 is still another local cross-sectional view illustrating the sensing device of FIG. 1 along section-line A-A'. As shown in FIG. 5, a conductive pattern 400c may be directly disposed on the substrate 110, and a semiconductor layer 200c covers on the conductive pattern 400c. An isolation layer 300a covers on the semiconductor layer 200c. In particular, the insulation layer 300a may only include the contact opening 340a. Referring to FIG. 1 and FIG. 5 together, the first detection electrode Ed1 and the second detection electrode Ed2, the first electrode E1 and the second electrode E2 are contacted with the semiconductor layer 200c respectively through the contact openings 340b and 340a.

Figure 6:
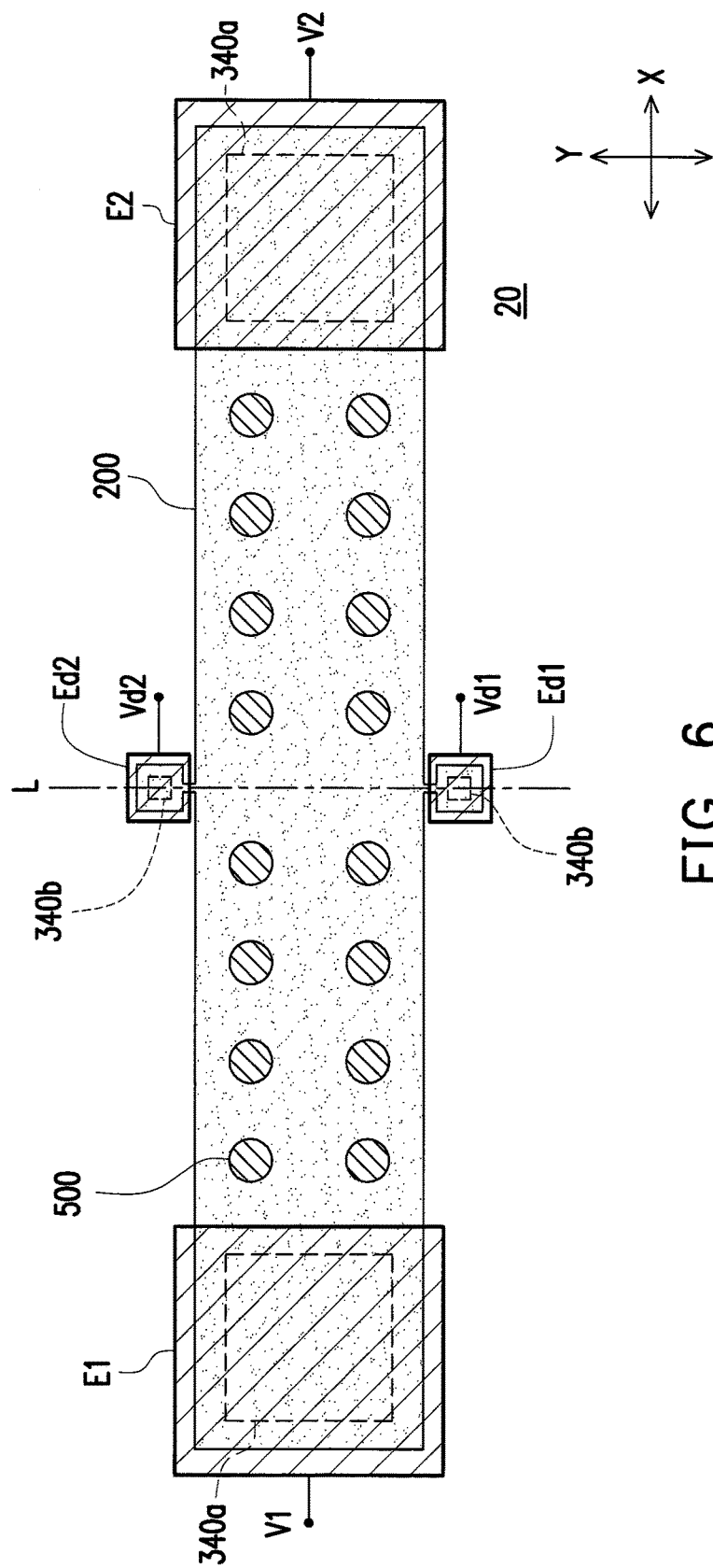
FIG. 6 is a top view of a sensing device according to another embodiment of the invention.

FIG. 6 is a top view of a sensing device 20 according to another embodiment of the invention. Referring to FIG. 6, the embodiment of FIG. 6 is similar to the embodiment of FIG. 1, thus identical or similar elements are indicated by identical or similar reference numbers, and the descriptions thereof are not repeated. A difference between the sensing device 20 of FIG. 6 and the sensing device 10 of FIG. 1 is that, the sensing device 20 of FIG. 6 includes a plurality of conductive patterns 500. In the present embodiment, the conductive patterns 500 are composed of a plurality of circular patterns having identical areas, but the invention is not limited thereto. The conductive patterns 500 may also be composed of circular patterns having different areas. A total area of the conductive patterns 500 may be identical to an area of the conductive pattern 400, but the invention is not limited thereto. In addition, as shown in FIG. 6, the conductive patterns 500 are arranged in an array and uniformly distributed between the first detection electrode Ed1 and the second detection electrode Ed2, and between the first electrode E1 and the second electrode E2. Similarly, the conductive patterns 500 do not overlap with the virtual connection line L.

Figure 7:
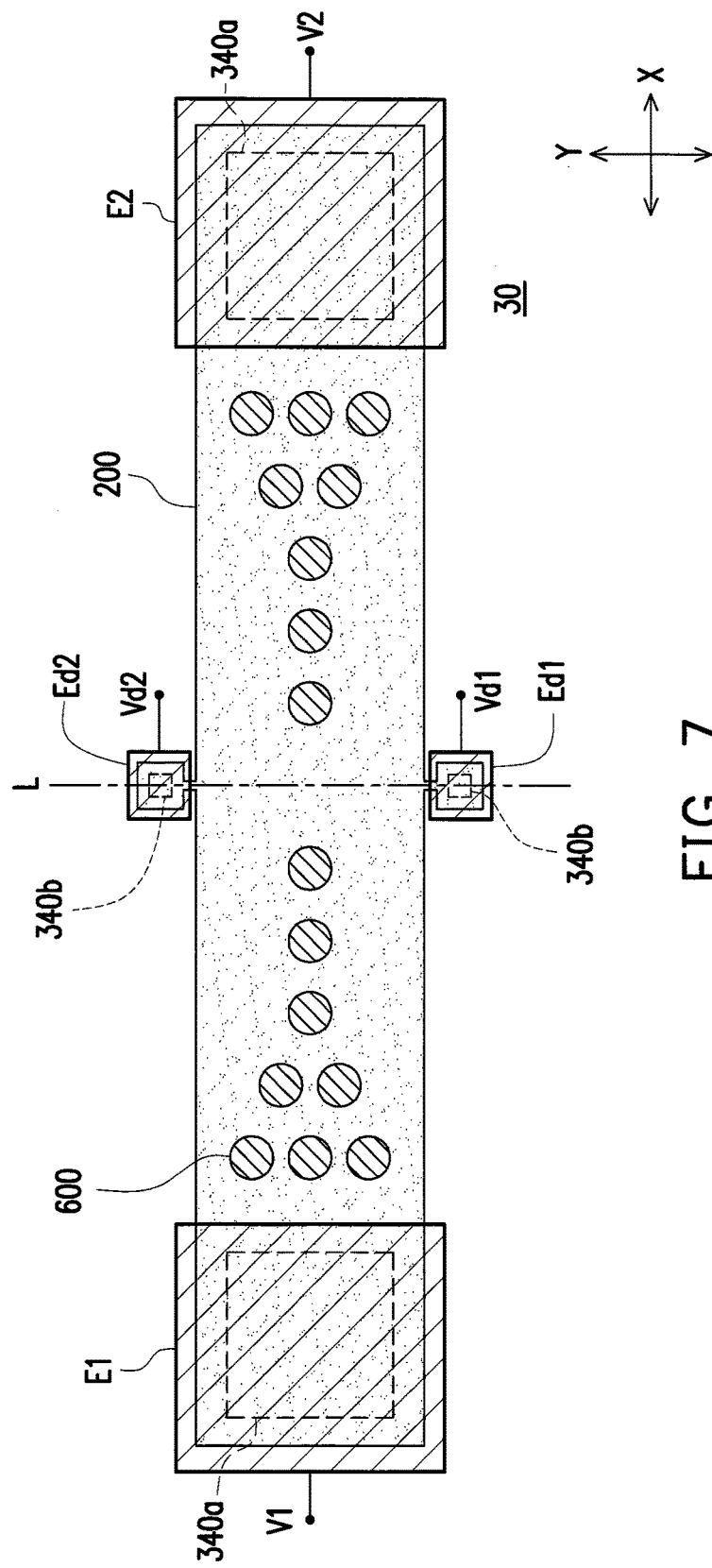
FIG. 7 is a top view of a sensing device according to another embodiment of the invention.

FIG. 7 is a top view of a sensing device 30 according to another embodiment of the invention. Referring to FIG. 7, the embodiment of FIG. 7 is similar to the embodiment of FIG. 1, thus identical or similar elements are indicated by identical or similar reference numbers, and the descriptions thereof are not repeated. A difference between the sensing device 30 of FIG. 7 and the sensing device 10 of FIG. 1 is that, the sensing device 30 includes a plurality of conductive patterns 600. A total area of the conductive patterns 600 may be identical to an area of the conductive pattern 400, but the invention is not limited thereto. In addition, an amount of the conductive patterns 600 is, for example, identical to an amount of the conductive patterns 500. In particular, the conductive patterns 600 of FIG. 7 use the virtual connection line L as an axis of symmetry, and a distribution density of the conductive patterns 600 is gradually increased along a direction towards the first electrode E1 and the second electrode E2 to be arranged in a pyramid shape. In other words, a density per unit area of the conductive patterns 600 is gradually increased from the virtual connection line L towards the first electrode E1 and the second electrode E2. Similarly, the conductive patterns 600 do not overlap with the virtual connection line L. In the present embodiment, the conductive patterns 600 are composed of a plurality of circular patterns having identical areas, but the invention is not limited thereto. An embodiment of FIG. 8 is used for further description below.

Figure 8:
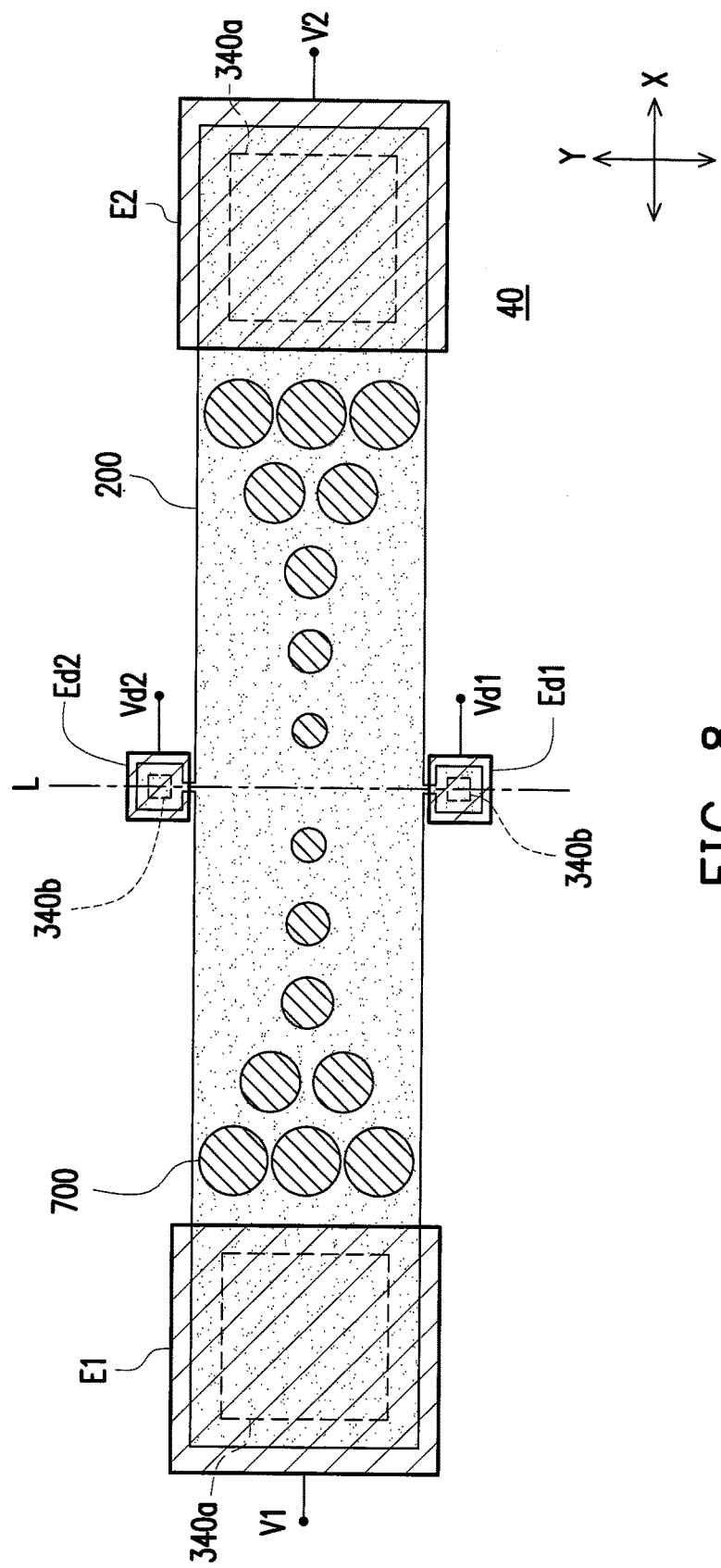
FIG. 8 is a top view of a sensing device according to yet another embodiment of the invention.

FIG. 8 is a top view of a sensing device 40 according to yet another embodiment of the invention. Referring to FIG. 8, the embodiment of FIG. 8 is similar to the embodiment of FIG. 1, thus identical or similar elements are indicated by identical or similar reference numbers, and the descriptions thereof are not repeated. A difference between the sensing device 40 of FIG. 8 and the sensing device 10 of FIG. 1 is that, the sensing device 40 includes a plurality of conductive patterns 700. A total area of the conductive patterns 700 may be identical to an area of the conductive pattern 400, but the invention is not limited thereto. Similarly, the conductive patterns 700 do not overlap with the virtual connection line L. In addition, an amount of the conductive patterns 700 is, for example, identical to an amount of the conductive patterns 500. As similar to the conductive patterns 600 of FIG. 7, the conductive patterns 700 of FIG. 8 use the virtual connection line L as an axis of symmetry, and a distribution density of the conductive patterns 700 is gradually increased along a direction towards the first electrode E1 and the second electrode E2 to be arranged in a pyramid shape. It is worth mentioning that, the conductive patterns 700 are composed of a plurality of circular patterns having different areas, and the areas of the conductive patterns 700 are gradually increased from the virtual connection line L along a direction towards the first electrode E1 and the second electrode E2. In other words, a density per unit area of the conductive patterns 700 is gradually increased from the virtual connection line L towards the first electrode E1 and the second electrode E2.

Figure 9:
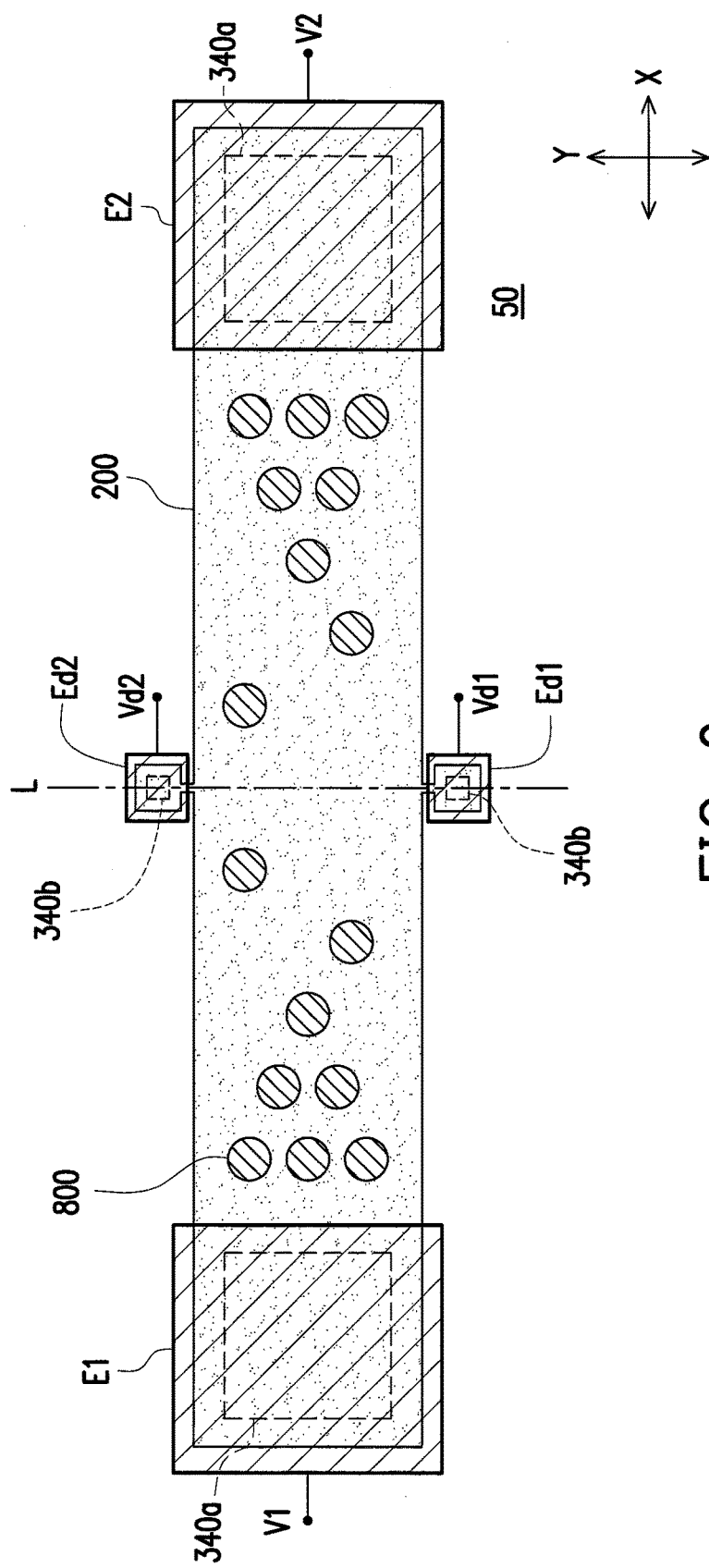
FIG. 9 is a top view of a sensing device according to still another embodiment of the invention.

FIG. 9 is a top view of a sensing device 50 according to still another embodiment of the invention. Referring to FIG. 9, the embodiment of FIG. 9 is similar to the embodiment of FIG. 1, thus identical or similar elements are indicated by identical or similar reference numbers, and the descriptions thereof are not repeated. A difference between the sensing device 50 of FIG. 9 and the sensing device 10 of FIG. 1 is that, the sensing device 50 of FIG. 9 includes a plurality of conductive patterns 800. In the present embodiment, the conductive patterns 800 are composed of a plurality of circular patterns having identical areas, but the invention is not limited thereto. A total area of the conductive patterns 800 may be identical to an area of the conductive pattern 400, but the invention is not limited thereto. In addition, an amount of the conductive patterns 800 is, for example, identical to an amount of the conductive patterns 500. In particular, the conductive patterns 800 of FIG. 9 use the virtual connection line L as an axis of symmetry, and a distribution density thereof is gradually increased along a direction towards the first electrode E1 and the second electrode E2 to be arranged in an irregular shape. In other words, a density per unit area of the conductive patterns 800 is gradually increased from the virtual connection line L towards the first electrode E1 and the second electrode E2. Similarly, the conductive patterns 800 do not overlap with the virtual connection line L.

Figure 10:
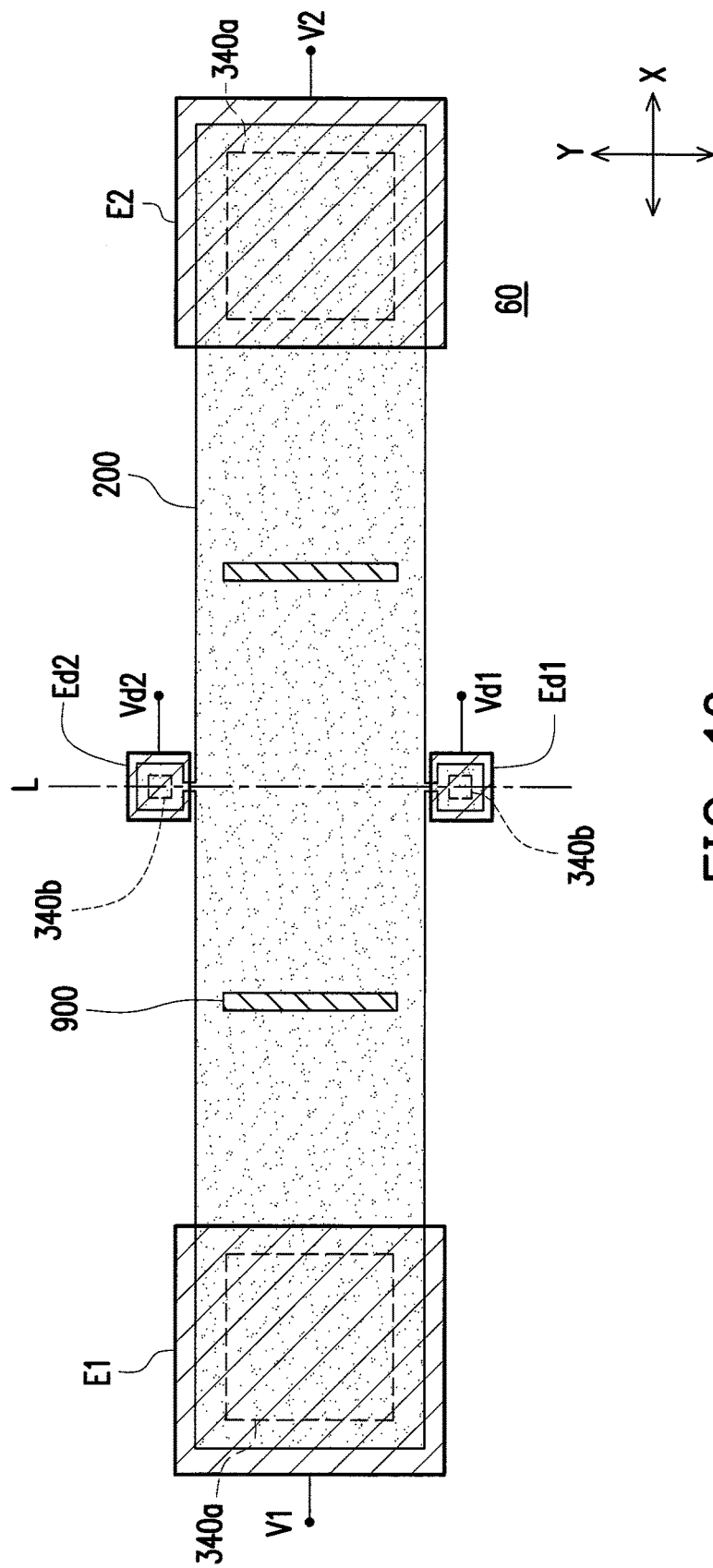
FIG. 10 is a top view of a sensing device according to another embodiment of the invention.
Figure 11:
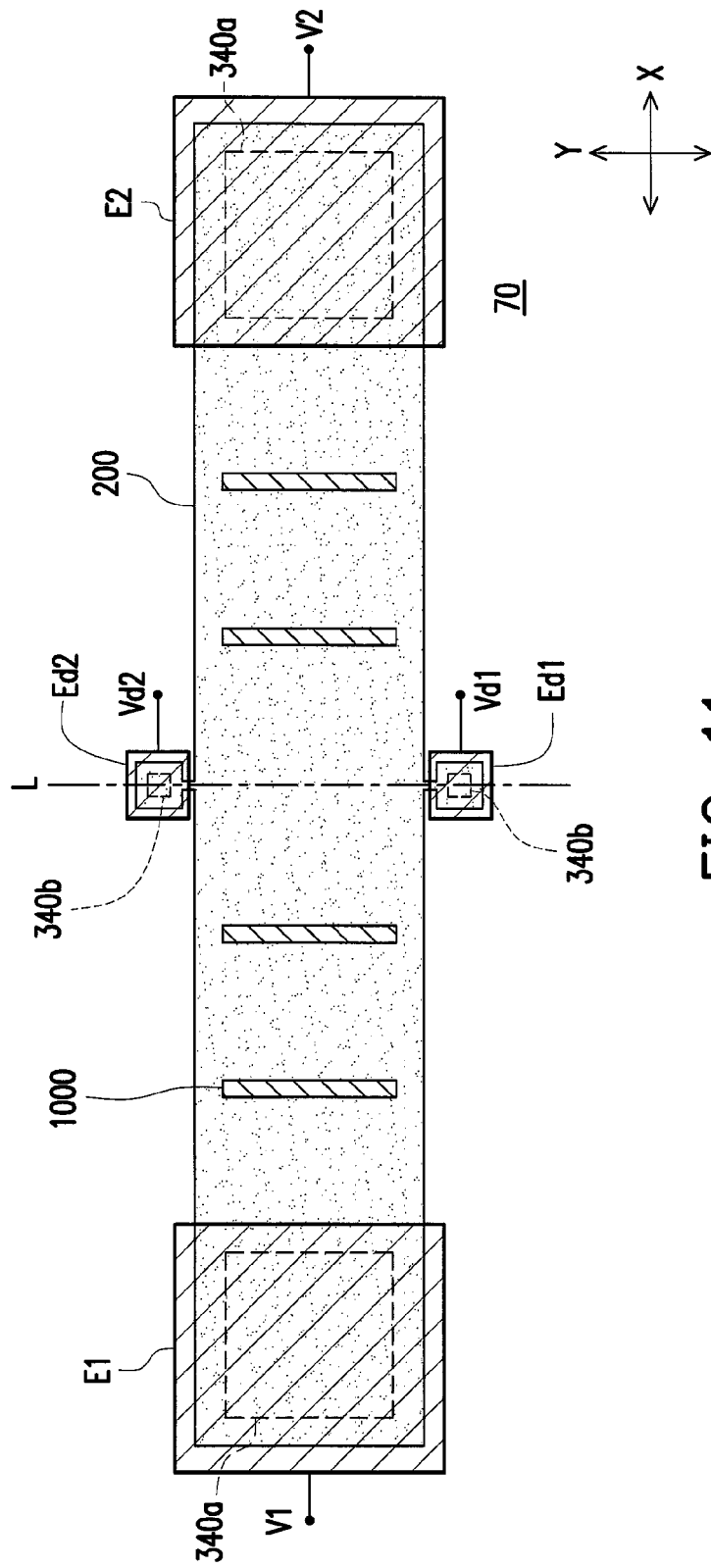
FIG. 11 is a top view of a sensing device according to yet another embodiment of the invention.
Figure 12:
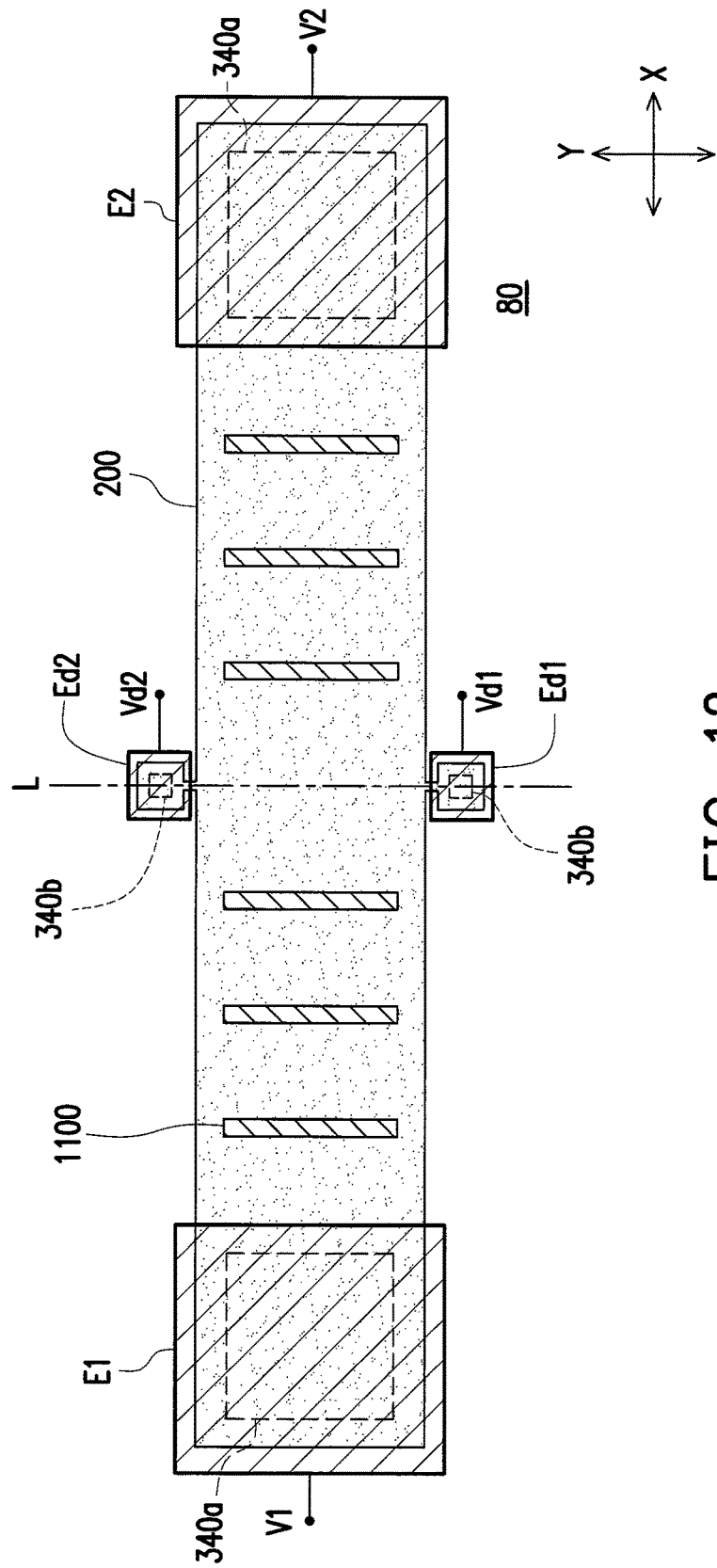
FIG. 12 is a top view of a sensing device according to still another embodiment of the invention.

Next, referring to FIG. 10 to FIG. 12 together. FIG. 10 is a top view of a sensing device 60 according to another embodiment of the invention. FIG. 11 is a top view of a sensing device 70 according to yet another embodiment of the invention. FIG. 12 is a top view of a sensing device 80 according to still another embodiment of the invention. The embodiments of FIG. 10 to FIG. 12 are similar to the embodiment of FIG. 1, thus identical or similar elements are indicated by identical or similar reference numbers, and the descriptions thereof are not repeated. A difference between the sensing devices 60, 70, 80 of FIG. 10 to FIG. 12 and the sensing device 10 of FIG. 1 is that, the sensing devices 60, 70, 80 of FIG. 10 to FIG. 12 includes a plurality of conductive patterns 900, 1000, 1100, respectively, and the conductive patterns 900, 1000, 1100 are composed of a plurality of long-rectangle patterns having identical areas, but the invention is not limited. It is worth mentioning that, the conductive patterns 900, 1000, 1100 are arranged at equal intervals in parallel and symmetrical to the virtual connection line L. Differences among the embodiments in FIG. 10 to FIG. 12 are distribution densities of the conductive patterns. More specifically, the distribution density of the conductive patterns 900 is of the smallest, and the distribution density of the conductive patterns 1100 is of the greatest. Similarly, the conductive patterns 900, 1000, 1100 do not overlap with the virtual connection line L.

Figure 13:
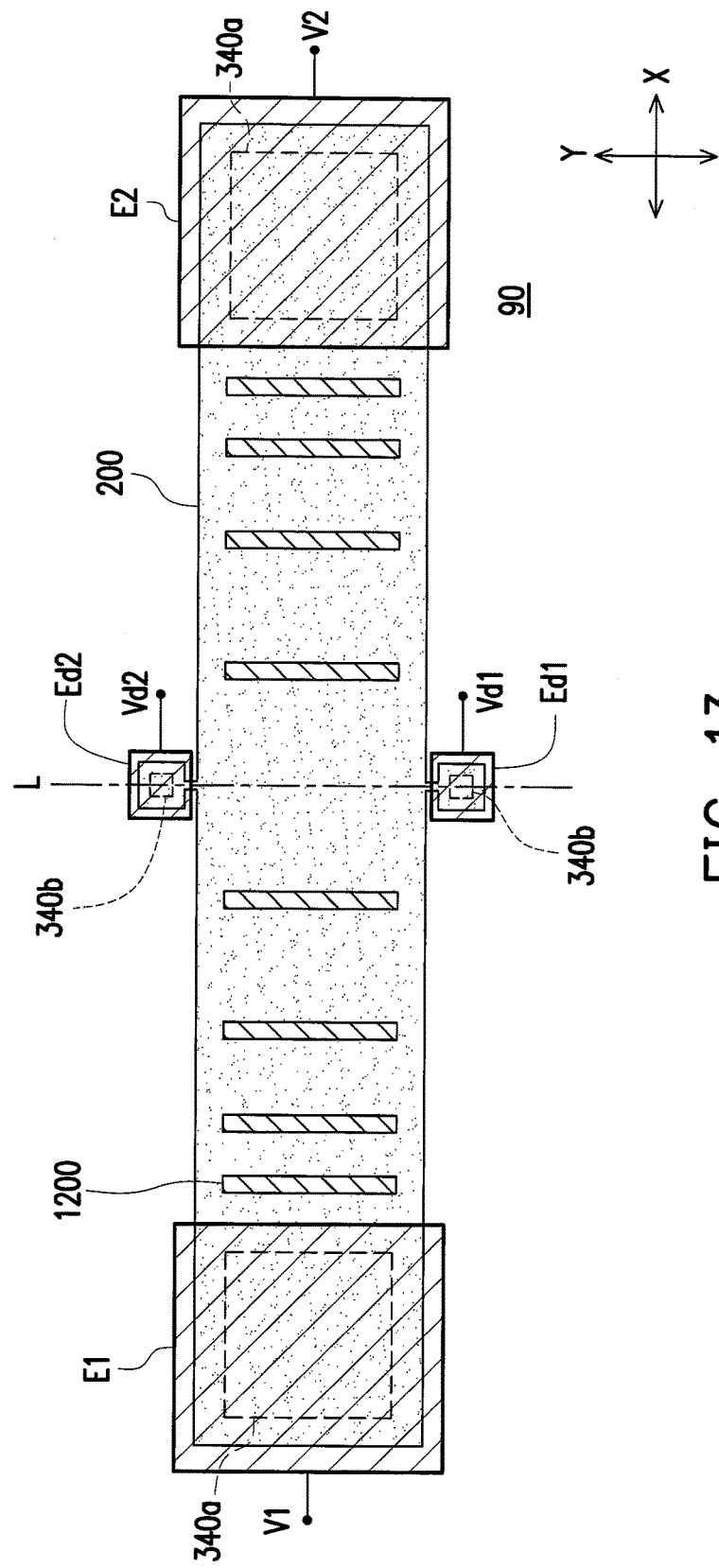
FIG. 13 is a top view of a sensing device according to again another embodiment of the invention.

Next, referring to FIG. 13, FIG. 13 is a top view of a sensing device 90 according to again another embodiment of the invention. The embodiment of FIG. 13 is similar to the embodiment of FIG. 1, thus identical or similar elements are indicated by identical or similar reference numbers, and the descriptions thereof are not repeated. A difference between the sensing device 90 of FIG. 13 and the sensing device 10 of FIG. 1 is that, the sensing device 90 of FIG. 13 includes a plurality of conductive patterns 1200. In the present embodiment, the conductive patterns 1200 are composed of a plurality of long-rectangle patterns having identical areas, but the invention is not limited thereto. In particular, the conductive patterns 1200 are arranged at non-equal intervals in parallel and symmetrical to the virtual connection line L. More specifically, a density per unit area of the conductive patterns 1200 is gradually increased from the virtual connection line L towards the first electrode E1 and the second electrode E2. Similarly, the conductive patterns 1100 do not overlap with the virtual connection line L.

Figure 14:
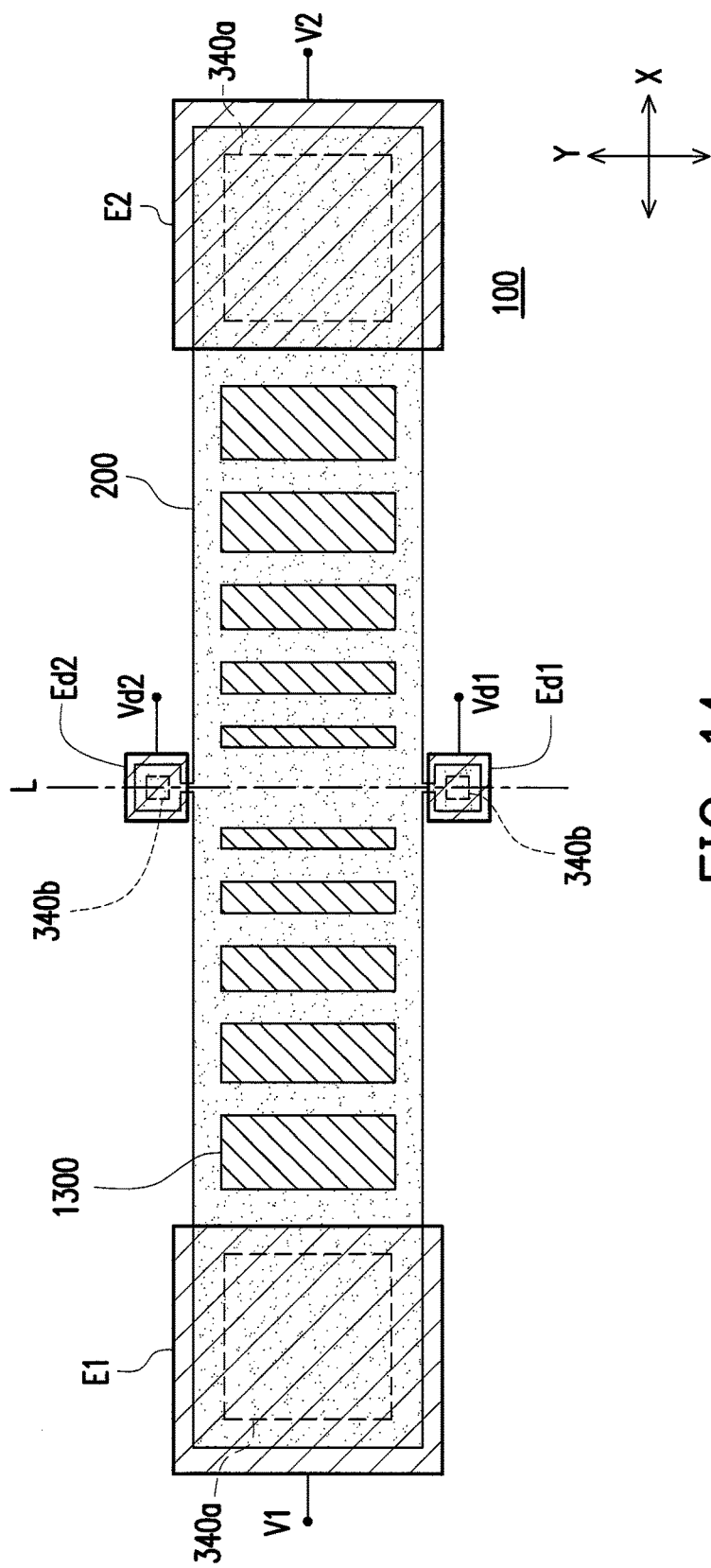
FIG. 14 is a top view of a sensing device according to yet still another embodiment of the invention.

Lastly, referring to FIG. 14, FIG. 14 is a top view of a sensing device 100 according to yet still another embodiment of the invention. The embodiment of FIG. 14 is similar to the embodiment of FIG. 1, thus identical or similar elements are indicated by identical or similar reference numbers, and the descriptions thereof are not repeated. A difference between the sensing device 100 of FIG. 14 and the sensing device 10 of FIG. 1 is that, the sensing device 100 of FIG. 14 includes a plurality of conductive patterns 1300. In particular, the conductive patterns 1300 are composed of a plurality of long-rectangle patterns having different areas, and the areas of the conductive patterns 1300 use the virtual connection line L as an axis of symmetry to be gradually increased along a direction towards the first electrode E1 and the second electrode E2. In other words, a density per unit area of the conductive patterns 1300 is gradually increased from the virtual connection line L towards the first electrode E1 and the second electrode E2. Similarly, the conductive patterns 1300 do not overlap with the virtual connection line L.

Hereinafter, the magnetoresistance and the Hall voltage of the sensing devices according the foregoing embodiments of the invention are measured and compared with sensing devices Q1, Q2 (referring to FIG. 15 and FIG. 16) of the comparison examples, so as to verify a sensing capability to the magnetic field direction and a magnetic sensitivity of the sensing devices of the invention.

Figure 15:
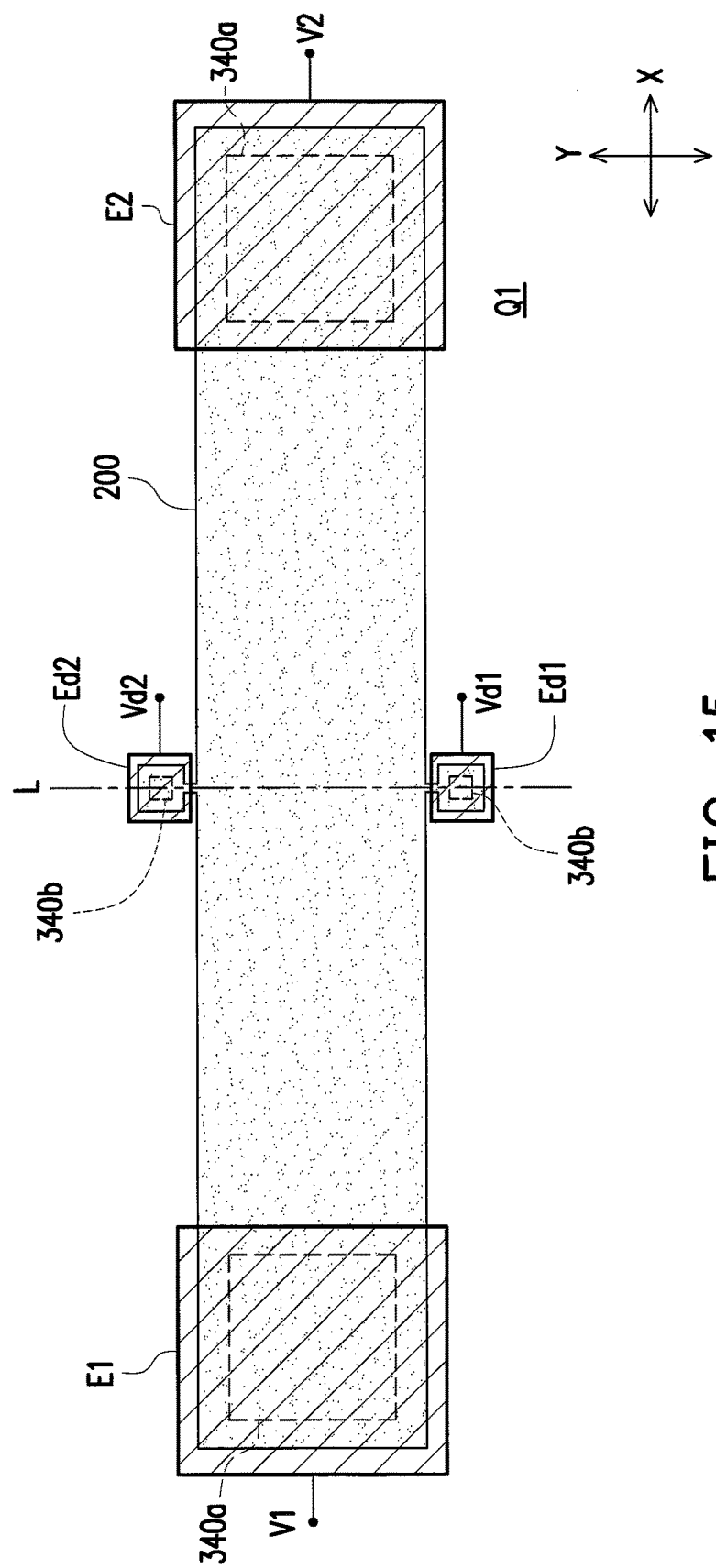
FIG. 15 is a top view of a sensing device according to a comparison example.
Figure 16:
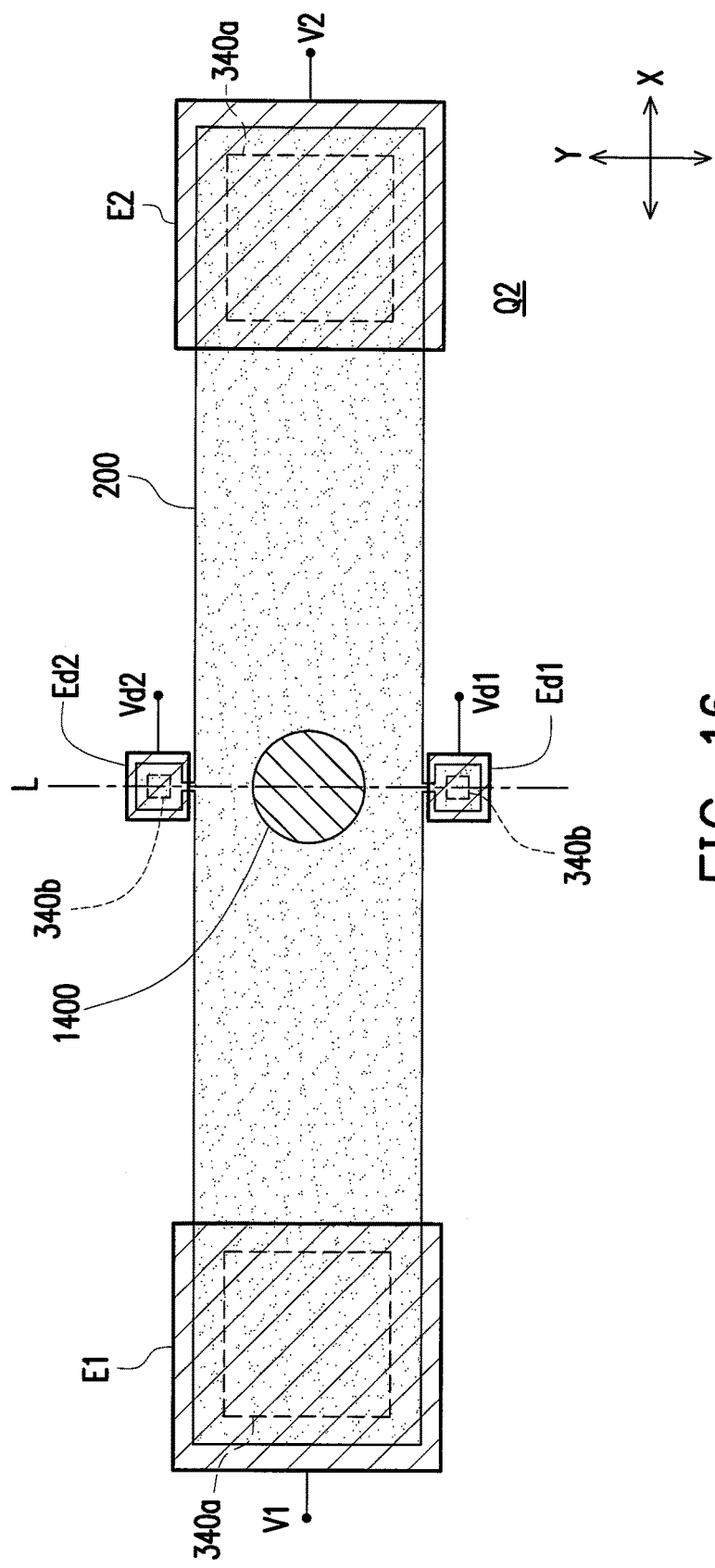
FIG. 16 is a top view of a sensing device according to another comparison example.

FIG. 15 is a top view of a sensing device Q1 according to a comparison example. FIG. 16 is a top view of a sensing device Q2 according to another comparison example. Referring to FIG. 15 and FIG. 16, the embodiments of FIG. 15 and FIG. 16 are similar to the embodiment of FIG. 1, thus identical or similar elements are indicated by identical or similar reference numbers, and the descriptions thereof are not repeated. As shown in FIG. 15, in the sensing device Q1 of the comparison example, a semiconductor layer 200 thereof is not disposed with the conductive pattern. Next, referring to FIG. 16, a conductive pattern 1400 of the sensing device Q2 of another comparison example is a circular shape having an area identical to that of the conductive pattern 400 (referring back to FIG. 1), and the only difference between the two is that the conductive pattern 1400 overlaps with the virtual connection line L.

Figure 17:
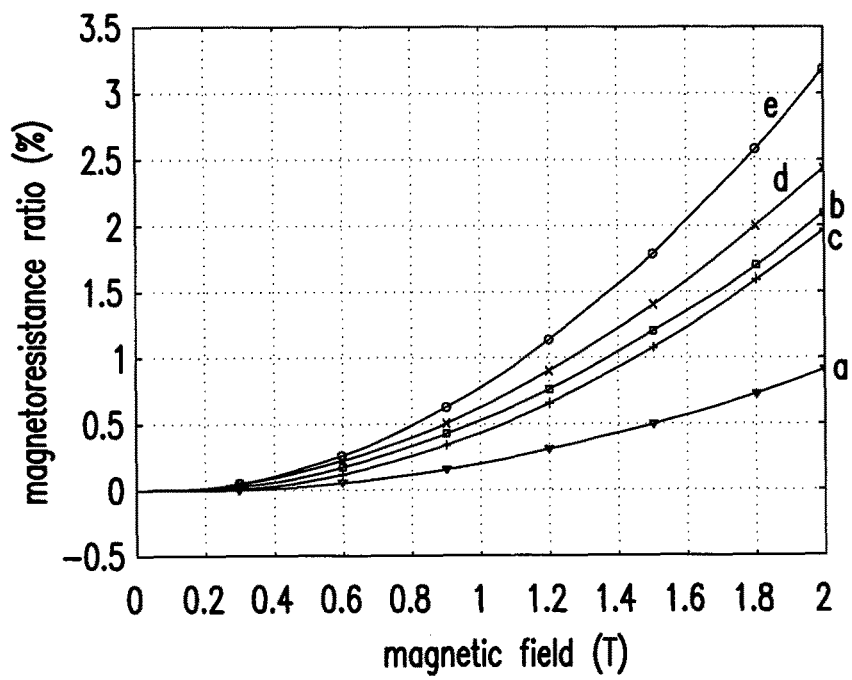
FIG. 17 is a characteristic curve diagram illustrating changes in magnetoresistance ratio with respect to the magnetic field for the sensing devices according to embodiments of the invention and the sensing device of the comparison example.

FIG. 17 is a characteristic curve diagram illustrating changes in magnetoresistance ratio with respect to the magnetic field for the sensing devices according to embodiments of the invention and the sensing device of the comparison example. Referring to FIG. 17, in which a vertical axis indicates a magnetoresistance ratio (MR ratio) (%), and a horizontal axis indicates a magnetic field for vertically passing through the device (hereinafter, magnetic field (Bz)) (T). Characteristic curves a, b are results from the sensing devices Q1, Q2 (referring to FIG. 15 and FIG. 16) respectively in different comparison examples. Characteristic curves c, d, e are results from the sensing devices 10, 30, 20 (referring to FIG. 1, FIG. 7 and FIG. 6) respectively in different embodiments of the invention. The magnetoresistance ratio being higher indicates that the sensitivity of the sensing device to the magnetic field variations is more sensitive. As shown in FIG. 17, when the magnetic field is 2T, the magnetoresistance ratio of the sensing device Q1 completely composed of semiconductor (the characteristic curve a) is 0.90%, whereas the magnetoresistance ratios of the sensing devices having the conductive patterns (the characteristic curves b, c, d, e) are all greater than 0.90%, which are respectively 2.09%, 1.98%, 2.45% and 3.19%. Moreover, in view of the results, it can be known that the conductive patterns having small areas are capable further improving the magnetoresistance of the sensing device, as compared to one conductive pattern having large area. Therein, the sensing device 20 including the conductive patterns which are arranged in a regular array has the greatest magnetoresistance ratio, and the magnetoresistance ratio thereof is approximate 3.5 times the magnetoresistance ratio of the sensing device Q1 completely composed of semiconductor.

Figure 18:
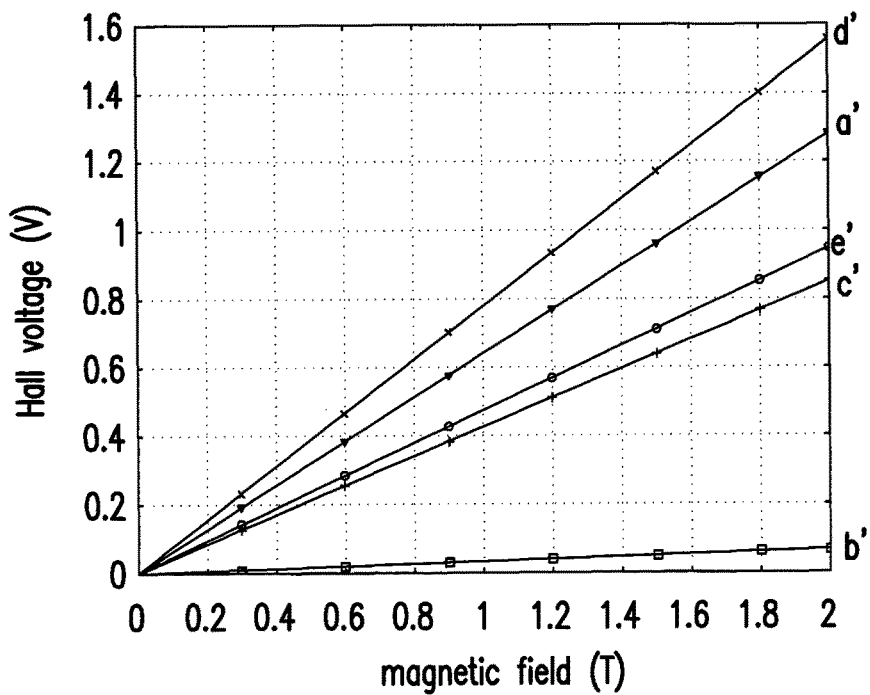
FIG. 18 is a characteristic curve diagram illustrating changes in the Hall voltage with respect to the magnetic field for the sensing devices according to embodiments of the invention and the sensing device of the comparison example.

FIG. 18 is a characteristic curve diagram illustrating changes in the Hall voltage with respect to the magnetic field for the sensing devices according to embodiments of the invention and the sensing device of the comparison example. Referring to FIG. 18, in which a vertical axis indicates the Hall voltage (V), and a horizontal axis indicates the magnetic field (Bz) (T). Similarly, characteristic curves a', b' are results from the sensing devices Q1, Q2 (referring to FIG. 15 and FIG. 16) respectively in different comparison examples. Characteristic curves c', d', e' are results from the sensing devices 10, 30, 20 (referring to FIG. 1, FIG. 7 and FIG. 6) respectively in different embodiments of the invention. The Hall voltage being higher indicates that the sensitivity of the sensing device to the magnetic field direction is more preferable. As shown in FIG. 18, when the magnetic field is 2T, the Hall voltage of the sensing device Q1 completely composed of semiconductor (the characteristic curve a') is 1.28V, whereas the Hall voltages of the sensing devices having the conductive patterns (the characteristic curves b', c', d', e') are respectively 0.06V, 0.83V, 1.55V and 0.95V. In view of the results above, it can be known that, most of the Hall voltages of the sensing devices having the conductive patterns are smaller than the Hall voltage of the sensing device Q1 completely composed of semiconductor. The Hall voltage of the sensing device Q2 having the conductive pattern that overlaps with the virtual connection line L (the characteristic curve b') is the smallest because the virtual connection line L passes through the conductive pattern composed of metal. As a result, distribution of the Hall voltage induced by the magnetic field between the first detection electrode Ed1 and the second detection electrode Ed2 is under influence of voltage equalizing inside the conductive pattern thereby resulting more loss to the Hall voltage. As similarly to the magnetoresistance ratio, the conductive patterns having small areas are capable of improving the Hall voltage of the sensing device. It is worth mentioning that, the Hall voltage of the sensing device 30 having the conductive patterns arranged in the pyramid shape is even more than the Hall voltage of the sensing device Q1 completely composed of semiconductor. Such result indicates that the Hall voltage may be improved through an appropriate distribution of the conductive patterns, so as to improve the capability of sensing device in sensing the magnetic field direction.

Figure 19:
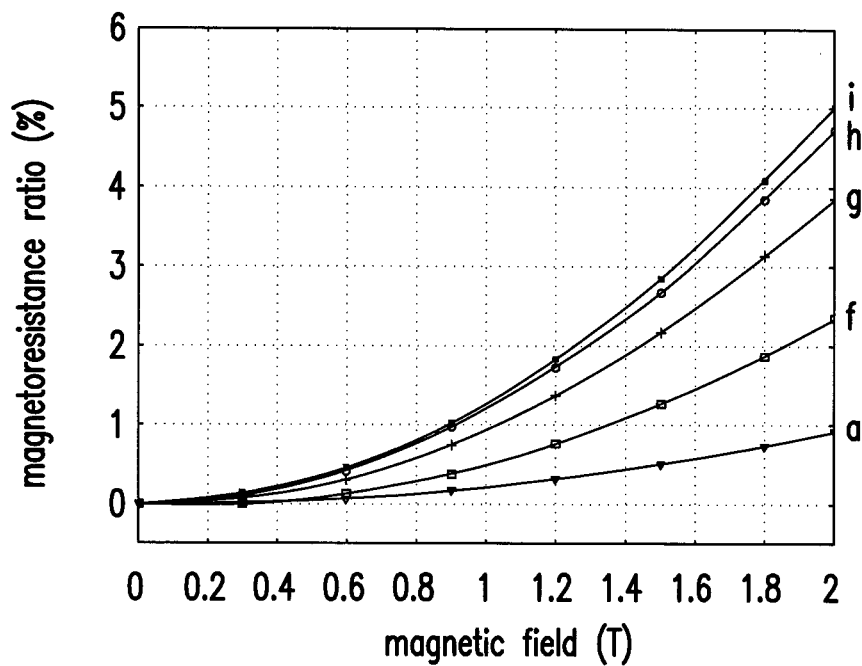
FIG. 19 is a characteristic curve diagram illustrating changes in magnetoresistance ratio with respect to the magnetic field for the sensing devices according to the other embodiments of the invention and the sensing device of the comparison example.

FIG. 19 is a characteristic curve diagram illustrating changes in magnetoresistance ratio with respect to the magnetic field for the sensing devices according to the other embodiments of the invention and the sensing device of the comparison example. Referring to FIG. 19, in which a vertical axis indicates a magnetoresistance ratio (MR ratio) (%), and a horizontal axis indicates the magnetic field (Bz) (T). The characteristic curves a is the result from the sensing device Q1 (referring to FIG. 15) of the comparison example. Characteristic curves f, g, h, i are results from the sensing devices 60, 70, 80, 100 (referring to FIG. 10, FIG. 11, FIG. 12 and FIG. 14) respectively in different embodiments of the invention. Similarly, the magnetoresistance ratio being higher indicates that the sensitivity of the sensing device to the magnetic field variations is more sensitive. As shown in FIG. 19, when the magnetic field is 2T, the magnetoresistance ratio of the sensing device Q1 completely composed of semiconductor (the characteristic curve a) is 0.90%, whereas the magnetoresistance ratios of the sensing devices having the conductive patterns (the characteristic curves f, g, h, i) are all greater than 0.90%, which are respectively 2.35%, 3.86%, 4.73% and 5.03%. In view of the results above, it can be known that the magnetoresistance of the sensing device may be improved by dividing the semiconductor layer into multiple regions through the long-rectangle conductive patterns. In addition, the magnetoresistance ratio of the sensing device may be further improved with increases in the density of the conductive patterns. More specifically, the sensing device 100 having the conductive patterns with the greatest density per unit area (the characteristic curve i) has the greatest the magnetoresistance ratio, which is approximate 5.6 times the magnetoresistance ratio of the sensing device Q1 completely composed of semiconductor.

Figure 20:
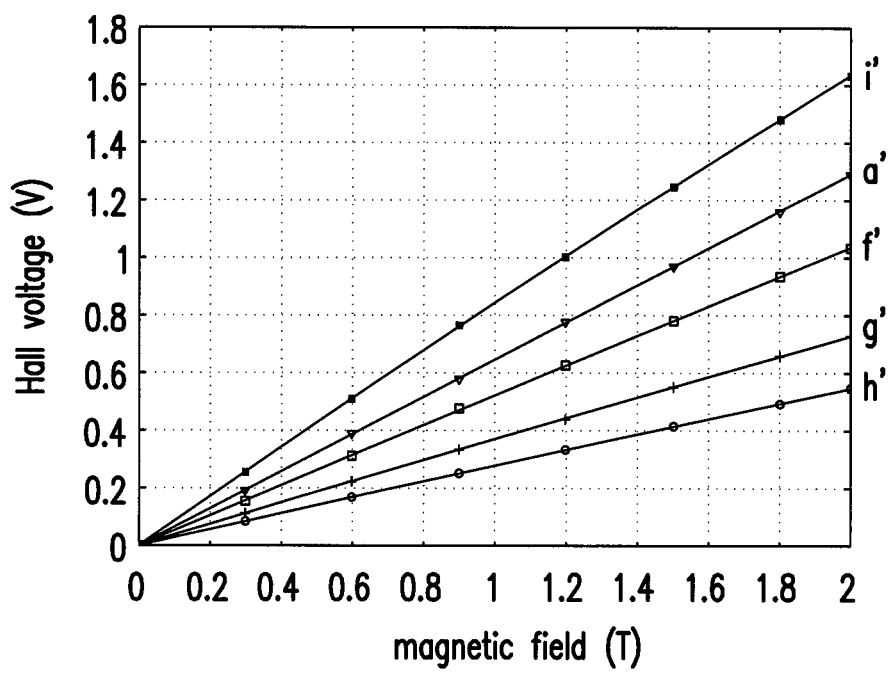
FIG. 20 is a characteristic curve diagram illustrating changes in the Hall voltage with respect to the magnetic field for the sensing devices according to other embodiments of the invention and the sensing device of the comparison example.

FIG. 20 is a characteristic curve diagram illustrating changes in the Hall voltage with respect to the magnetic field for the sensing devices according to other embodiments of the invention and the sensing device of the comparison example. Referring to FIG. 20, in which a vertical axis indicates the Hall voltage (V), and a horizontal axis indicates the magnetic field (Bz) (T). Similarly, the characteristic curves a' is the result from the sensing device Q1 (referring to FIG. 15) of the comparison example. Characteristic curves f', g', h', i' are results from the sensing devices 60, 70, 80, 100 (referring to FIG. 10, FIG. 11, FIG. 12 and FIG. 14) respectively in different embodiments of the invention. Similarly, the Hall voltage being higher indicates that the sensitivity of the sensing device to the magnetic field direction is more preferable. As shown in FIG. 20, when the magnetic field is 2T, the Hall voltage of the sensing device Q1 completely composed of semiconductor (the characteristic curve a') is 1.28V, whereas the Hall voltages of the sensing devices having the conductive patterns (the characteristic curves f', g', h', i') are respectively 1.03V, 0.73V, 0.55V and 1.63V. In view of the results above, it can be known that, when the conductive patterns composed of metal are distributed with equal intervals in the semiconductor layer, the conductive patterns may equalize voltages in the patterns to drop the Hall voltage. Moreover, the Hall voltage may be dropped with increases in the density of the metal patterns. Therefore, the Hall voltages of the sensing devices 60, 70, 80 are smaller than the Hall voltage of the sensing device Q1 completely composed of semiconductor. Particularly, the Hall voltage of the sensing device 100 (which is composed of the long-rectangle metal and including the areas that use the virtual connection line L as the axis of symmetry to be gradually increased along the direction towards the first electrode E1 and the second electrode E2) is larger than the Hall voltage of the sensing device Q1 completely composed of semiconductor. Such result indicates that the Hall voltage may be improved through an appropriate distribution of the conductive patterns, so as to improve the capability of sensing device in sensing the magnetic field direction.

It should be noted that, generally, the Hall voltage property and the magnetic sensing property in the sensing device are counterbalance. Therefore, except for the distribution of the special conductive patterns as shown in FIG. 14, it is not easy to take consideration of both the high Hall voltage property and the high magnetic sensing property at the same time. However, as compared to the Hall voltage, the magnetoresistance has higher sensitivity in sensing the magnetic field variations. Accordingly, as along as the Hall voltage of the sensing device is sufficient for the sensing device to determine the magnetic field direction, the invention may focus on realizing the best performance for the magnetic sensing property as the primary consideration in terms of designing the sensing device. Based on the consideration above, when the magnetic field is 2T, the sensing device 90 according to a more preferable embodiment of the invention (referring to FIG. 13) has the magnetoresistance ratio as high as 5.88% and the Hall voltage being 0.66V. That is, the sensing device 90 is capable of taking consideration of the both the sensing capability to the magnetic field direction and the high sensitivity to the magnetic field at the same time.

In summary, in the sensing device of the invention, an active layer hybridized with metal and semiconductor is provided by disposing the conductive pattern on the semiconductor layer. Accordingly, in comparison with the sensing device only composed of semiconductor, the sensing device has less dependence on temperature for the magnetic sensing property. In addition, by providing the conductive patterns with different shapes and different distribution densities, the sensing device of the invention is capable of taking consideration of the both the sensing capability to the magnetic field direction and the high sensitivity to the magnetic field.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A sensing device, comprising:
a semiconductor layer;
a first electrode and a second electrode, disposed at opposite ends of the semiconductor layer;
a first detection electrode and a second detection electrode, disposed at other opposite ends of the semiconductor layer, wherein a virtual connection line is defined through the first detection electrode and the second detection electrode; and
a plurality of conductive patterns, disposed on the semiconductor layer, wherein the conductive patterns do not overlap with the virtual connection line, the at least one conductive pattern is contacted with the semiconductor layer, and areas of the conductive patterns are gradually increased from the virtual connection line towards the first electrode and the second electrode.

2. The sensing device of claim 1, wherein the semiconductor layer has at least one opening, and the at least one conductive pattern is filled into the opening to be contacted with the semiconductor layer.

3. The sensing device of claim 2, further comprising an insulation layer, the insulation layer having at least one first opening and a plurality of contact openings to expose the at least one opening, and the contact openings exposing the semiconductor layer, wherein the at least one conductive pattern is contacted with the semiconductor layer through the opening and the first opening, and the first electrode, the second electrode, the first detection electrode and the second detection electrode are contacted with the semiconductor layer respectively through the contact openings.

4. The sensing device of claim 1, further comprising an insulation layer to cover the semiconductor layer, and the insulation layer having at least one first opening to expose the semiconductor layer, wherein the at least one conductive pattern is filled into the first opening to be contacted with the semiconductor layer.

5. The sensing device of claim 4, wherein the insulation layer has a plurality of contact openings to expose the semiconductor layer, and the first electrode, the second electrode, the first detection electrode and the second detection electrode are contacted with the semiconductor layer respectively through the contact openings.

6. The sensing device of claim 1, further comprising an insulation layer to cover the semiconductor layer, and the insulation layer having at least one first opening to expose the semiconductor layer, wherein the at least one conductive pattern is doped in the semiconductor layer through the first opening.

7. The sensing device of claim 6, wherein the insulation layer has a plurality of contact openings to expose the semiconductor layer, and the first electrode, the second electrode, the first detection electrode and the second detection electrode are contacted with the semiconductor layer respectively through the contact openings.

8. The sensing device of claim 1, wherein the at least one conductive pattern is disposed on a substrate, and the semiconductor layer covers the at least one conductive pattern.

9. The sensing device of claim 8, further comprising an insulation layer to cover the semiconductor layer, the insulation layer having a plurality of contact openings to expose the semiconductor layer, and the first electrode, the second electrode, the first detection electrode and the second detection electrode being contacted with the semiconductor layer respectively through the contact openings.

10. A sensing device, comprising:
a semiconductor layer;
a first electrode and a second electrode, disposed at opposite ends of the semiconductor layer;
a first detection electrode and a second detection electrode, disposed at other opposite ends of the semiconductor layer, wherein a virtual connection line is defined through the first detection electrode and the second detection electrode; and
a plurality of conductive patterns, disposed on the semiconductor layer, wherein the conductive patterns do not overlap with the virtual connection line, the at least one conductive pattern is contacted with the semiconductor layer, and a density per unit area of the conductive patterns is gradually increased from the virtual connection line towards to the first electrode and the second electrode.

11. A sensing device, comprising:
a semiconductor layer;
a first electrode and a second electrode, disposed at opposite ends of the semiconductor layer;
a first detection electrode and a second detection electrode, disposed at other opposite ends of the semiconductor layer, wherein a virtual connection line is defined through the first detection electrode and the second detection electrode;
at least one conductive pattern, disposed on the semiconductor layer, wherein the conductive pattern does not overlap with the virtual connection line, and the at least one conductive pattern is contacted with the semiconductor layer; and
an insulation layer, having a plurality of contact openings to expose the semiconductor layer, wherein the first electrode, the second electrode, the first detection electrode and the second detection electrode are contacted with the semiconductor layer respectively through the contact openings.

12. The sensing device of claim 11, wherein the semiconductor layer has at least one opening, and the at least one conductive pattern is filled into the opening to be contacted with the semiconductor layer.

13. The sensing device of claim 12, wherein the insulation layer has at least one first opening and the contact openings to expose the at least one opening, and the at least one conductive pattern is contacted with the semiconductor layer through the opening and the first opening.

14. The sensing device of claim 11, wherein the insulation layer covers the semiconductor layer, the insulation layer has at least one first opening to expose the semiconductor layer, and the at least one conductive pattern is filled into the first opening to be contacted with the semiconductor layer.

15. The sensing device of claim 11, wherein the insulation layer covers the semiconductor layer, the insulation layer has at least one first opening to expose the semiconductor layer, and the at least one conductive pattern is doped in the semiconductor layer through the first opening.

16. The sensing device of claim 11, wherein the at least one conductive pattern is disposed on a substrate, the semiconductor layer covers the at least one conductive pattern.

17. The sensing device of claim 16, wherein the insulation layer covers the semiconductor layer.

18. The sensing device of claim 11, wherein the at least one conductive pattern is a plurality of conductive patterns, and the conductive patterns do not overlap with the virtual connection line.

19. The sensing device of claim 18, wherein the conductive patterns are uniformly distributed between the first electrode and the second electrode.

20. The sensing device of claim 18, wherein areas of the conductive patterns are identical.

* * * * *